United States Patent
Stainer et al.

(10) Patent No.: US 8,247,824 B2
(45) Date of Patent: Aug. 21, 2012

(54) ELECTRONIC DEVICES COMPRISING ELECTRODES THAT CONNECT TO CONDUCTIVE MEMBERS WITHIN A SUBSTRATE AND PROCESSES FOR FORMING THE ELECTRONIC DEVICES

(76) Inventors: Matthew Stainer, Goleta, CA (US); Matthew Stevenson, Goleta, CA (US); Stephen Sorich, Goleta, CA (US)

(*) Notice: Subject to any disclaimer, the term of this patent is extended or adjusted under 35 U.S.C. 154(b) by 1537 days.

(21) Appl. No.: 11/525,660

(22) Filed: Sep. 22, 2006
(Under 37 CFR 1.47)

(65) Prior Publication Data
US 2011/0169017 A1 Jul. 14, 2011

Related U.S. Application Data

(60) Provisional application No. 60/751,502, filed on Dec. 19, 2005.

(51) Int. Cl.
*H01L 29/18* (2006.01)
(52) U.S. Cl. ......... 257/88; 257/E51.02; 257/40; 438/24; 313/506
(58) Field of Classification Search .......... 257/316, 257/40, 88.642, E51.02; 438/24; 313/503, 313/504, 506, 509
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,190 A | 9/1993 | Friend et al. | |
| 5,317,169 A | 5/1994 | Nakano et al. | |
| 5,408,109 A | 4/1995 | Heeger et al. | |
| 7,166,860 B2* | 1/2007 | Sorich et al. | 257/40 |
| 2006/0138401 A1* | 6/2006 | Yu et al. | 257/40 |

OTHER PUBLICATIONS

CRC Handbook of Chemistry and Physics, 81$^{st}$ Edition, 2000 (Book Not Included).

* cited by examiner

*Primary Examiner* — Julio J Maldonado
*Assistant Examiner* — Sonya McCall Shepard

(57) ABSTRACT

An electronic device includes a substrate. The substrate includes a first pixel driving circuit, a first conductive member, and a second conductive member. The first and second conductive members are spaced apart from each other. The first conductive member is connected to the first pixel driving circuit. The second conductive member is part of a power transmission line. The electronic device further includes a well structure overlying the substrate and defining a pixel opening, a via, and a channel. The pixel opening is connected to the via through the channel. In addition, the electronic device includes a first electronic component. The electronic component includes a first electrode that contacts the first conductive member in the pixel opening, a second electrode that contacts the second conductive member in the via, and an organic layer lying between the first and second electrodes.

20 Claims, 8 Drawing Sheets

ELECTRONIC DEVICES COMPRISING ELECTRODES THAT CONNECT TO CONDUCTIVE MEMBERS WITHIN A SUBSTRATE AND PROCESSES FOR FORMING THE ELECTRONIC DEVICES

CROSS REFERENCE TO RELATED APPLICATIONS

This application claims the benefit of priority under 35 U.S.C. §119(e) from provisional U.S. Application No. 60/751,502, "Electronic Devices Comprising Electrodes That Connect to Conductive Members Within a Substrate and Processes for Forming the Electronic Devices", Stainer, et al., filed Dec. 19, 2005, which is incorporated herein by reference in its entirety.

BACKGROUND INFORMATION

1. Field of the Disclosure

The invention relates generally to organic electronic devices, and more particularly to electronic devices comprising electrodes that connect to conductive members within a substrate and processes for forming the electronic devices.

2. Description of the Related Art

Electronic devices, including organic electronic devices, continue to be more extensively used in everyday life. Examples of organic electronic devices include Organic Light-Emitting Diodes ("OLEDs"). OLEDs, which are examples of electronic components, can be used in passive matrix displays and active matrix displays. Making connections within active matrix displays are more complicated than passive matrix displays because pixel driving circuits lie within an array. A conventional design for an active matrix OLED display includes a common cathode with relatively high electrical conductivity that provides $V_{ss}$ to electronic components within the array. The common cathode design may complicate connections because the $V_{ss}$ connection may be at a significantly different elevation, with respect to pixel driving circuits, compared to connections for select (scan) lines, data lines, and $V_{dd}$ lines. Additionally, a top-emission active matrix OLED design may require relatively high transparency and relatively low reflectivity for the cathode, which, for typical cathode materials, conflicts with the need for relatively high electrical conductivity.

$V_{ss}$ lines can be placed on or within the substrate. The connections between the cathodes and the $V_{ss}$ lines can be incorporated into an encapsulation scheme. However, such a design can make encapsulation significantly more complicated and reduce manufacturing margins in making a proper seal to keep air, water, and other contaminants away from the OLEDs and circuits within the electronic device.

The foregoing general description and the following detailed description are exemplary and explanatory only and are not restrictive of the invention, as defined in the appended claims.

SUMMARY

In a first aspect, an electronic device includes a substrate. The substrate includes a first pixel driving circuit, a first conductive member, and a second conductive member. The first and second conductive members are spaced apart from each other. The first conductive member is connected to the first pixel driving circuit. The second conductive member is part of a power transmission line. The electronic device further includes a well structure overlying the substrate and defining a pixel opening, a via, and a channel. The pixel opening is connected to the via through the channel. In addition, the electronic device includes a first electronic component. The electronic component includes a first electrode that contacts the first conductive member in the pixel opening, a second electrode that contacts the second conductive member in the via, and an organic layer lying between the first and second electrodes.

In a second aspect, a process for forming an electronic device includes forming a well structure and a first electrode over a substrate. The substrate includes a first pixel driving circuit, a first conductive member, and a second conductive member. The first and second conductive members are spaced apart from each other. The well structure defines a pixel opening and a via. The first conductive member is connected to the first pixel driving circuit in the pixel opening. The second conductive member is part of a power transmission line. The process further includes forming a first organic layer over the first electrode and forming a second electrode over the first organic layer. The second electrode contacts the second conductive member in the via.

BRIEF DESCRIPTION OF THE DRAWINGS

The invention is illustrated by way of example and not limitation in the accompanying figures.

Figure 1:
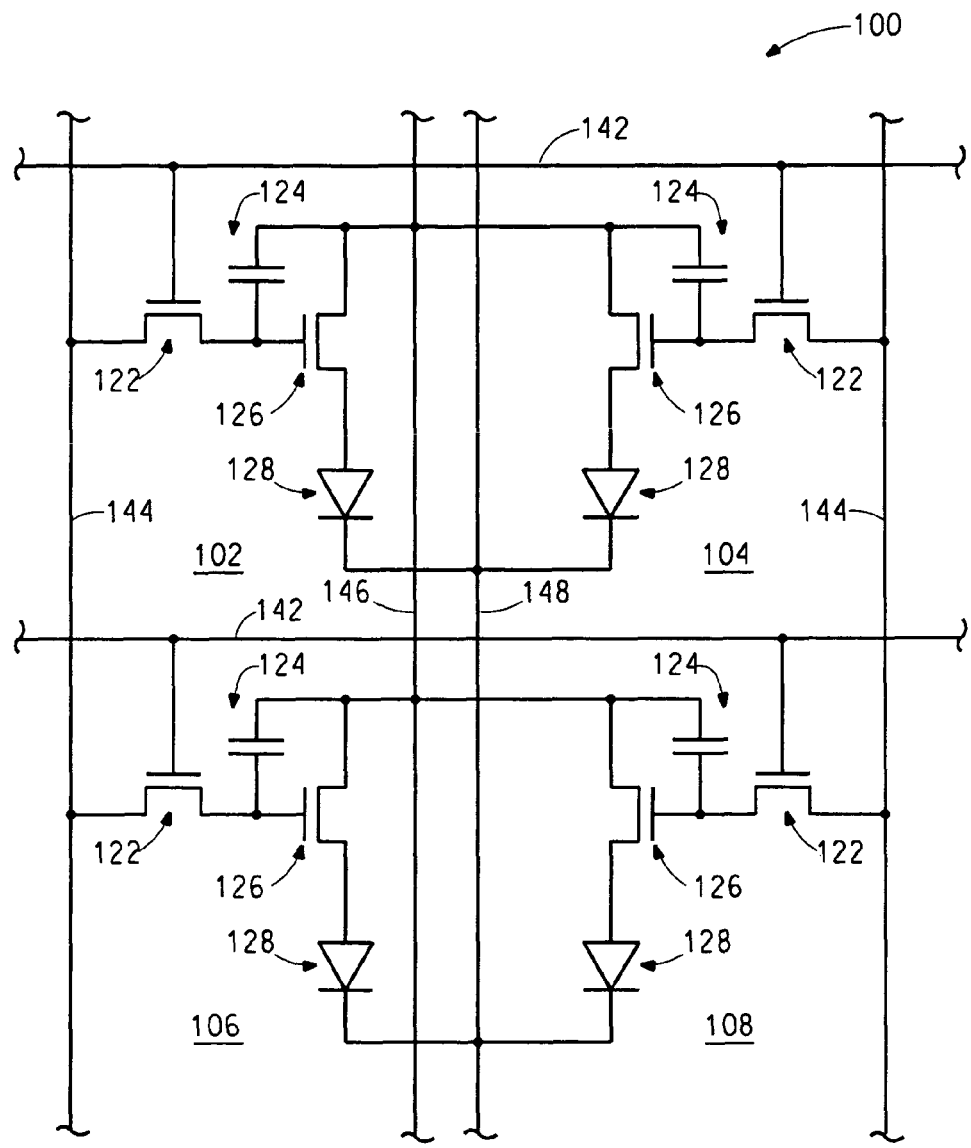
FIG. 1 includes a circuit diagram of a portion of an array within an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

In a first aspect, an electronic device includes a substrate. The substrate includes a first pixel driving circuit, a first conductive member, and a second conductive member. The first and second conductive members are spaced apart from each other. The first conductive member is connected to the first pixel driving circuit. The second conductive member is part of a power transmission line. The electronic device further includes a well structure overlying the substrate and defining a pixel opening, a via, and a channel. The pixel opening is connected to the via through the channel. In addition, the electronic device includes a first electronic component. The electronic component includes a first electrode that contacts the first conductive member in the pixel opening, a second electrode that contacts the second conductive member in the via, and an organic layer lying between the first and second electrodes.

In one embodiment of the first aspect, the substrate includes a plurality of pixel driving circuits including the first pixel driving circuit, additional first conductive members, and additional second conductive members, wherein each of the first conductive members is spaced apart from each of the second conductive members. In addition, the well structure includes a plurality of pixel openings and a plurality of vias, the electronic device includes an array of electronic components including the first electronic component, wherein each of the electronic components includes a first electrode that contacts at least one of the first conductive members in at least one of the pixel openings, and a second electrode that contacts at least one of the second conductive members in at least one of the vias. Additionally, the organic layer lies between the first and second electrodes.

In another embodiment of the first aspect, the surface of the well structure in the channel is hydrophobic. In still another embodiment of the first aspect, from a cross-sectional view, the well structure in the pixel opening has a negative slope. In yet another embodiment of the first aspect, from a cross-sectional view, the well structure in the channel has a positive slope.

In a further embodiment of the first aspect, the electronic device includes a channel structure within the channel, wherein from a cross-sectional view, the channel structure has a positive slope. In a more specific embodiment, the well structure and the channel structure are a same material or a different material. In another more specific embodiment, the surface of the channel structure is hydrophobic.

In still yet another embodiment of the first aspect, the organic layer includes an organic active layer. In still yet a further embodiment of the first aspect, the first electronic component includes a radiation-emitting electronic component or a radiation-responsive electronic component. In a more specific embodiment, the first electronic component emits or responds to radiation through the first electrode, the second electrode, or both the first and the second electrodes.

In another embodiment of the first aspect, the power transmission line is a $V_{dd}$ line or a $V_{ss}$ line. In yet another embodiment of the first aspect, the well structure defining the pixel opening includes a first material and the well structure defining the via includes a second material different from the first material.

In a second aspect, a process for forming an electronic device includes forming a well structure and a first electrode over a substrate. The substrate includes a first pixel driving circuit, a first conductive member, and a second conductive member. The first and second conductive members are spaced apart from each other. The well structure defines a pixel opening and a via. The first conductive member is connected to the first pixel driving circuit in the pixel opening. The second conductive member is part of a power transmission line. The process further includes forming a first organic layer over the first electrode and forming a second electrode over the first organic layer. The second electrode contacts the second conductive member in the via.

In one embodiment of the second aspect, the well structure further defines a channel, wherein the pixel opening is connected to the via through the channel. In a more specific embodiment, the process further includes treating the surface of the well structure in the channel to make the surface hydrophobic. In still a more specific embodiment, the process further includes forming a channel structure within the channel, wherein from a cross-sectional view, the channel structure has a positive slope.

In another embodiment of the second aspect, the organic layer is deposited using a liquid deposition technique. In a more specific embodiment, the liquid deposition technique comprises continuous nozzle printing or ink jet printing.

In yet another embodiment of the second aspect, the substrate further includes a plurality of pixel driving circuits including the first pixel driving circuit, additional first conductive members, and additional second conductive members. Each of the first conductive members is spaced apart from the second conductive members. The electronic device further includes an array of electronic components and the pixel driving circuits lie within the array. Forming the first electrode includes forming the first electrodes over the first conductive members. Forming the second electrode includes forming the second electrodes over the first organic layer.

Other features and advantages of the invention will be apparent from the following detailed description, and from the claims. The detailed description first addresses Definitions and Clarification of Terms followed by the Layout and Fabrication Process, Other Embodiments, and Advantages.

1. DEFINITIONS AND CLARIFICATION OF TERMS

Before addressing details of embodiments described below, some terms are defined or clarified. As used herein, the term "active" when referring to a layer or material is intended to mean a layer or material that exhibits electro-radiative or electro-magnetic properties. An active layer material may emit radiation or exhibit a change in concentration of electron-hole pairs when receiving radiation.

The terms "array," "peripheral circuitry" and "remote circuitry" are intended to mean different areas or components. For example, an array may include pixels, cells, or other electronic devices within an orderly arrangement (usually designated by columns and rows) within a component. These electronic devices may be controlled locally on the component by peripheral circuitry, which may lie within the same component as the array but outside the array itself. Remote circuitry typically lies away from the peripheral circuitry and can send signals to or receive signals from the array (typically via the peripheral circuitry). The remote circuitry may also perform functions unrelated to the array.

The term "channel" is intended to mean a passage between openings.

The term "channel structure" is intended to mean a structure overlying a substrate, wherein the structure is at least partially located in a channel defined by another structure or structures.

The terms "conductive member" is intended to mean a member or structure, wherein current can flow through such member or structure without a significant drop in potential. Electrodes, terminals, and interconnects are examples of conductive members.

The term "connected," with respect to electronic components, circuits, or portions thereof, is intended to mean that two or more electronic components, circuits, or any combination of at least one electronic component and at least one circuit do not have any intervening electronic component lying between them. Note that such electronic components, circuits, or portions thereof may or may not contact one another. Parasitic resistance, parasitic capacitance, or both are not considered electronic components for the purposes of this definition. In one embodiment, electronic components are connected when they are electrically shorted to one another and lie at substantially the same voltage. Note that electronic components can be connected together using fiber optic lines to allow optical signals to be transmitted between such electronic components.

The term "contact" is intended to mean that two or more objects physically touch one another.

The term "electrode" is intended to mean a member or structure configured to transport carriers within an electronic component. For example, an electrode may be an anode, a cathode, a capacitor electrode, a gate electrode, etc.

The term "electronic component" is intended to mean a lowest level unit of a circuit that performs an electrical or electro-radiative (e.g., electro-optic) function. An electronic component may include a transistor, a diode, a resistor, a capacitor, an inductor, a semiconductive member laser, an optical switch, or the like. An electronic component does not include parasitic resistance (e.g., resistance of a wire) or parasitic capacitance (e.g., capacitive coupling between two conductive members connected to different electronic components where a capacitor between the conductive members is unintended or incidental).

The term "electronic device" is intended to mean a collection of circuits, electronic components, or combinations thereof that collectively, when properly connected and supplied with the appropriate potential(s), performs a function. An electronic device may include or be part of a system. An example of an electronic device includes a display, a sensor array, a computer system, an avionics system, an automobile, a cellular phone, or other consumer or industrial electronic product.

The term "hydrophilic" is intended to mean that an edge of a liquid exhibits a wetting angle less than 90 degrees with respect to a surface that it contacts.

The term "hydrophobic" is intended to mean that an edge of a liquid exhibits a wetting angle of 90 degrees or more with respect to a surface that it contacts.

The term "insulating" and its variants are intended to mean a material, layer, member, or structure having an electrical property such that it substantially prevents a significant number of charge carriers from flowing through such material, layer, member or structure.

The term "isotropic etch" is intended to mean an etch that occurs substantially equally in vertical and horizontal directions from a cross-sectional view of a substrate. The term "anisotropic etch" is intended to mean an etch that occurs at a significantly higher rate in a one direction compared to another direction when etching the same material. Although no etch is entirely isotropic or anisotropic, etches tend to be significantly more isotropic or anisotropic compared to the other (of anisotropic or isotropic).

The term "liquid deposition technique" is intended to mean a process wherein a layer is deposited onto a substrate in the form of a liquid. After deposition, the layer may be dried such that it is no longer in the form of a liquid.

The term "negative slope" is intended to mean a characteristic of a structure, wherein a side of the structure forms an acute angle with respect to a substantially planar surface over which the structure is formed.

The term "opening" is intended to mean an area characterized by the absence of a particular structure that delimits the area, as viewed from the perspective of a plan view.

The term "organic active layer" is intended to mean one or more organic layers, wherein at least one of the organic layers, by itself, or when in contact with a dissimilar material is capable of forming a rectifying junction.

The term "organic electronic component" is intended to mean an electronic component that includes one or more layers including organic material.

The term "overlying" does not necessarily mean that a layer, member, or structure is immediately next to or in contact with another layer, member, or structure.

The term "perimeter" is intended to mean a boundary that, from a plan view, surrounds at least a portion of a corresponding component or structure.

The term "pixel" is intended to mean the smallest complete unit of a display as observed by a user of the display. The term "subpixel" is intended to mean a portion of a pixel that makes up only a part, but not all, of a pixel. In a full-color display, a full-color pixel can comprise three sub-pixels with primary colors in red, green and blue spectral regions. A monochromatic display may include pixels but no subpixels.

The term "pixel driving circuit" is intended to mean a circuit within an array of pixels or subpixels that controls the signal(s) for no more than one pixel. Note that a driving circuit that controls the signal(s) for only one subpixel, and not the entire pixel, is still referred to as a pixel driving circuit, as used in this specification.

The term "positive slope" is intended to mean a characteristic of a structure, wherein a side of the structure forms an obtuse angle with respect to a substantially planar surface over which the structure is formed.

The term "power transmission line" is intended to mean one or more conductive members within an electronic device designed to transmit a power supply signal. The one or more conductive members are at substantially the same voltage as the power supply signal. An example of a power transmission line includes a $V_{dd}$ line or a $V_{ss}$ line.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component can sense or respond to radiation at a targeted wavelength or spectrum of wavelengths. The radiation may be within the visible-light spectrum or outside the visible-light spectrum (UV or IR). Photodetectors, IR sensors, biosensors, and photovoltaic cells are examples of radiation-responsive components.

The term "substrate" is intended to mean a workpiece that can be either rigid or flexible and may include one or more layers of one or more materials, which can include, but are not limited to, glass, polymer, metal or ceramic materials, or combinations thereof.

The term "surface treatment" is intended to mean an action performed to change a property of an exposed surface. In one embodiment, a surface treatment makes an exposed surface more hydrophobic or more hydrophilic. Each of fluorinating or adding a surfactant to an exposed surface is an example of a surface treatment.

The term "via" is intended to mean an opening that allows two or more electronic components to be connected such that they are electrically shorted to one another and lie at substantially the same voltage.

The term "well structure" is intended to mean a structure overlying a substrate, wherein the structure serves a principal function of at least partially separating an object, a region, or any combination thereof within or overlying the substrate from another object or region.

The term "wetting angle" is intended to mean a tangent angle defined by (1) a solid surface and (2) an interface between a gas and a liquid at the solid surface as measured from the solid surface through the liquid to the gas-liquid interface.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an "inclusive or" and not to an "exclusive or." For example, a condition A or B is satisfied by any one of the following: A is true (or present) and B is false (or not present), A is false (or not present) and B is true (or present), and both A and B are true (or present).

Additionally, for clarity purposes and to give a general sense of the invention, the use of the "a" or "an" are employed to describe elements and components of the invention. This description should be read to include one or at least one and the singular also includes the plural unless it is clear that it is meant otherwise.

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Group numbers corresponding to columns within the Periodic Table of the elements use the "New Notation" convention as seen in the *CRC Handbook of Chemistry and Physics*, 81$^{st}$ Edition (2000).

To the extent not described herein, many details regarding specific materials, processing acts, and circuits are conventional and may be found in textbooks and other sources within the organic light-emitting diode display, photodetector, and semiconductive member arts.

2. LAYOUT AND FABRICATION PROCESS

FIG. 1 includes a circuit diagram of a portion of an array within an electronic device 100 including pixels 102, 104, 106, and 108. In an alternative embodiment, each of the pixels 102, 104, 106, and 108 can be sub-pixels. For the purposes of this specification, the term pixel will be used although skilled artisans will appreciate that the concepts described herein can be extended to sub-pixels within pixels. As illustrated in FIG. 1, each of the pixels 102, 104, 106, and 108 include a pixel driving circuit that includes a select transistor 122, a storage capacitor 124, and a driving transistor 126. A gate electrode of the select transistor 122 is connected to a select line 142. In one embodiment, the select lines 142 are activated as a function of time, and therefore, each select line 142 is a scan line. A first source/drain region of select transistor 122 is connected to a data line 144. A second source/drain region of the select transistor 122, a first electrode of the storage capacitor 124, and the gate electrode of the driving transistor 126 are connected to one another. A first source/drain region of the driving transistor 126 is connected to an anode of an electronic component 128. In one embodiment, the electronic components 128 are radiation-emitting components, and in another embodiment, the electronic components 128 are radiation-responsive components. A cathode of the electronic components 128 is connected to a power transmission line, which in this embodiment is a $V_{ss}$ line 148. A second electrode of the storage capacitor 124 and a second source/drain region of the driving transistor 126 are connected to another power transmission line, which in this embodiment is a $V_{dd}$ line 146. After reading this specification, skilled artisans will appreciate that the array may extend in one or more directions and may include nearly any finite number of pixels similar to the ones illustrated in FIG. 1.

In other embodiments, other electronic components may be used in place of or in conjunction with the electronic components illustrated in FIG. 1. For example, one or more p-channel transistors can be used in place of or in conjunction with the n-channel transistors illustrated in FIG. 1. The exact type and configuration of electronic components within the pixel driving circuits are highly variable and can be chosen to fit the needs or desires for a particular application. After reading this specification, skilled artisans will appreciate that anodes of the electronic components 128 may be connected to the $V_{dd}$ line 146, and cathodes of the electronic components 128 may be connected to source/drain regions of the driving transistors 126. The other source/drain regions of the driving transistors 126 may be connected to the $V_{ss}$ line 148.

The layout and fabrication of the electronic device 100 in accordance with the circuit diagram illustrated in FIG. 1 is described below. After reading this specification, skilled artisans will appreciate that the invention is not limited to the specific circuit diagram, layouts, and fabrication processes described herein.

Figure 2:
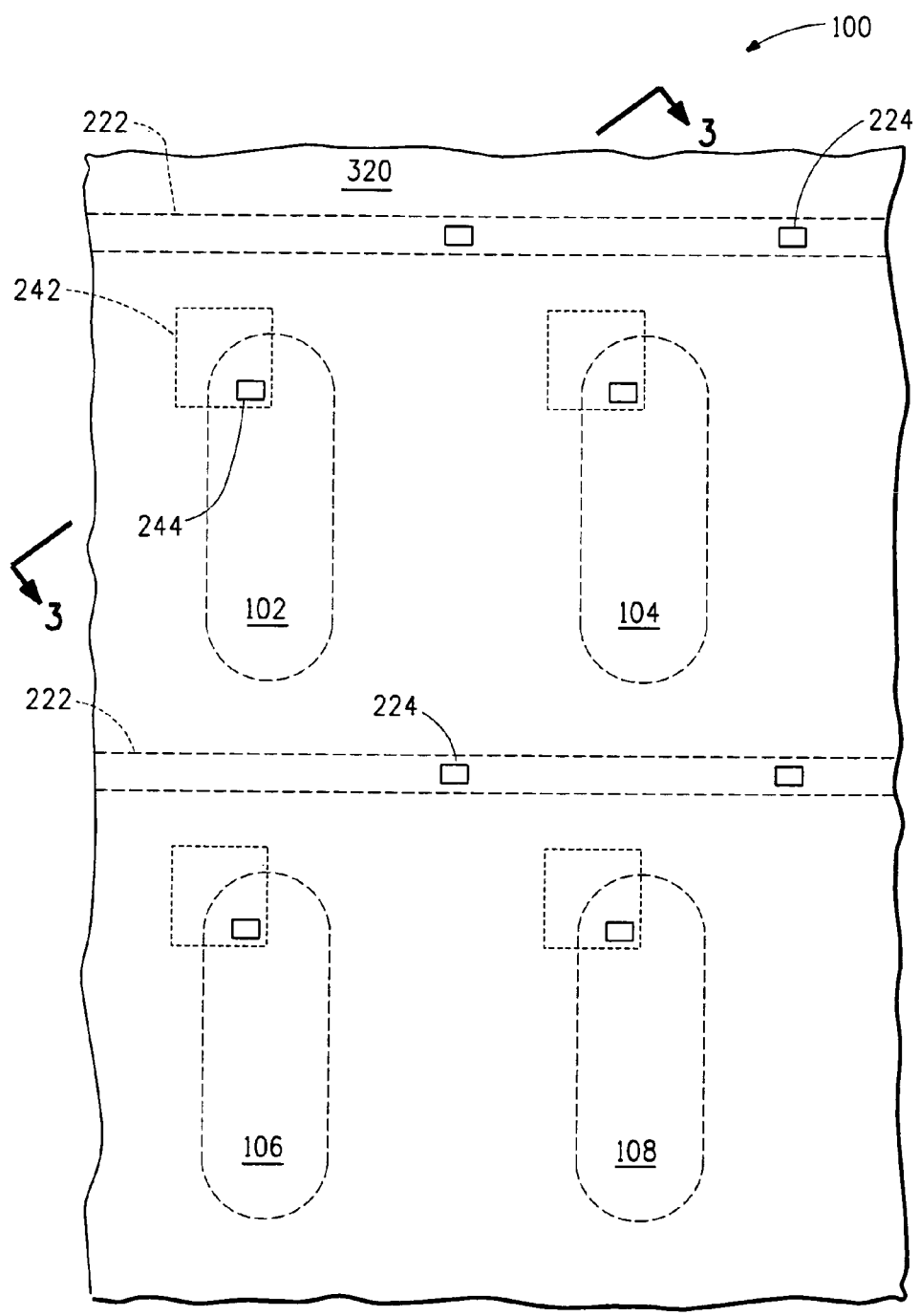
FIGS. 2 and 3 include illustrations of a plan view and a cross-sectional view, respectively, of a portion of substrate after forming openings to exposed conductive members for the pixel driving circuits and $V_{dd}$ line.
Figure 3:
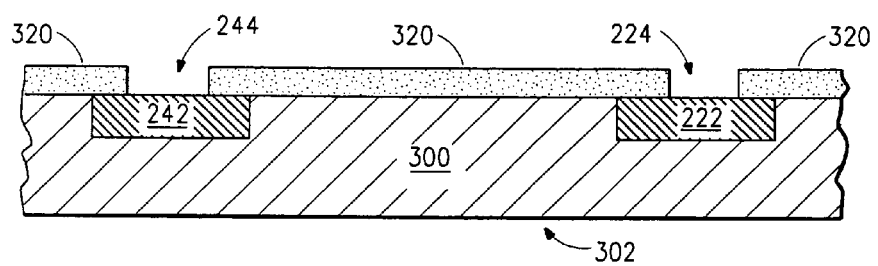

FIGS. 2 and 3 include illustrations of a plan view and a cross-sectional view, respectively, of a portion of a substrate after forming openings that expose first and second conductive members. Referring to FIG. 2, areas that will correspond to the pixels 102, 104, 106, and 108 are illustrated with one set of dashed lines, and pixel driving circuits 242 are illustrated with dashed line boxes. First conductive members lie at the bottom of openings 244, and each are connected to the underlying pixel driving circuit. The first conductive members are part of or connected to the second source/drain regions of the driving transistors 126. A second conductive member 222 lies at the bottom of openings 224. The second conductive member 222 is part of a power transmission line, which in this embodiment is a $V_{ss}$ line 148. Referring to FIG. 3, which is a cross-sectional view at the sectioning line 3-3 in FIG. 2, the pixel driving circuits 242 and the second conductive member 222 lie within a substrate 300. Each of the substrate 300, pixel driving circuits 242, including first conductive members, and the second conductive member 222 include materials and are formed using conventional techniques. In one embodiment, the substrate 300 is rigid, and in another embodiment is flexible. In one specific embodiment, the substrate 300 is transparent and includes a user side 302 opposite a surface of the substrate 300 where electronic device formation occurs. In another specific embodiment the substrate 300 is opaque, and is not part of the user side (not illustrated) of the electronic device 100.

An insulating layer 320 is formed over the substrate 300, pixel driving circuits 242, and second conductive member 222. The insulating layer 320 can include silicon dioxide, silicon nitride, organic insulating material, or any combination thereof. The insulating layer 320 can be formed by depositing using a conventional technique. The insulating layer 320 has a thickness that is sufficient to insulate a subsequently-formed electrode or other conductive members from underlying electronic components within the substrate 300. In one embodiment, the insulating layer 320 has a thickness in a range of approximately 0.1-5.0 microns. A conventional lithographic operation is performed to form openings 224 and 244 within the insulating layer 320. After reading this specification, skilled artisans will appreciate that more or fewer openings 224 or 244 may be formed. The number of openings 224, 244, or a combination thereof can include one opening per pixel or sub-pixel or group of pixels or sub-pixels. For example, one opening 224 may be used for a pixel that include red, green, and blue sub-pixels. In another embodiment, the number of openings for each pixel or sub-pixel can be more than one. To list all the combinations would be nearly impossible. Also, although not illustrated, any one or more of the pixel driving circuits 242 may or may not be connected to the second conductive member 222. As previously stated, the layout options are many, and after reading this specification, skilled artisans will understand how to design a layout that best meets their needs or desires.

At this point in the process, first conductive members within the pixel driving circuits 242 and the second conductive member 222 are exposed. The first conductive members and second conductive member 222 can include at least one element selected from Groups 4-6, 8 and 10-14 of the Periodic Table, or any combination thereof. In one embodiment, the first conductive members and second conductive member 222 can include Cu, Al, Ag, Au, Mo, or any combination thereof. In another embodiment, where the first conductive members and second conductive member 222 include more than one layer, one of the layers can include Cu, Al, Ag, Au, Mo, or any combination thereof and another layer can include Mo, Cr, Ti, Ru, Ta, W, Si, or any combination thereof. In one embodiment, the second conductive member may include an Al layer covered by a layer of Mo, Cr, Ti, Ru, Ta, W, or any combination thereof. Note that conductive metal oxide(s), conductive metal nitride(s) or a combination thereof may be used in place of or in conjunction with any of the elemental metals or alloys thereof.

Figure 5:
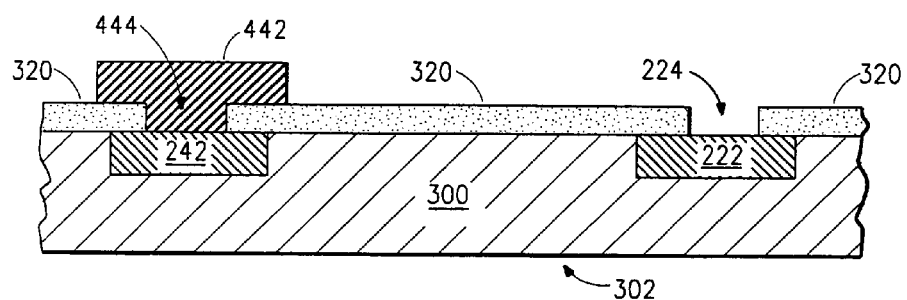
FIGS. 4 and 5 include illustrations of a plan view and a cross-sectional view, respectively, of the portion of the substrate of FIGS. 2 and 3 after forming first electrodes.
Figure 4:
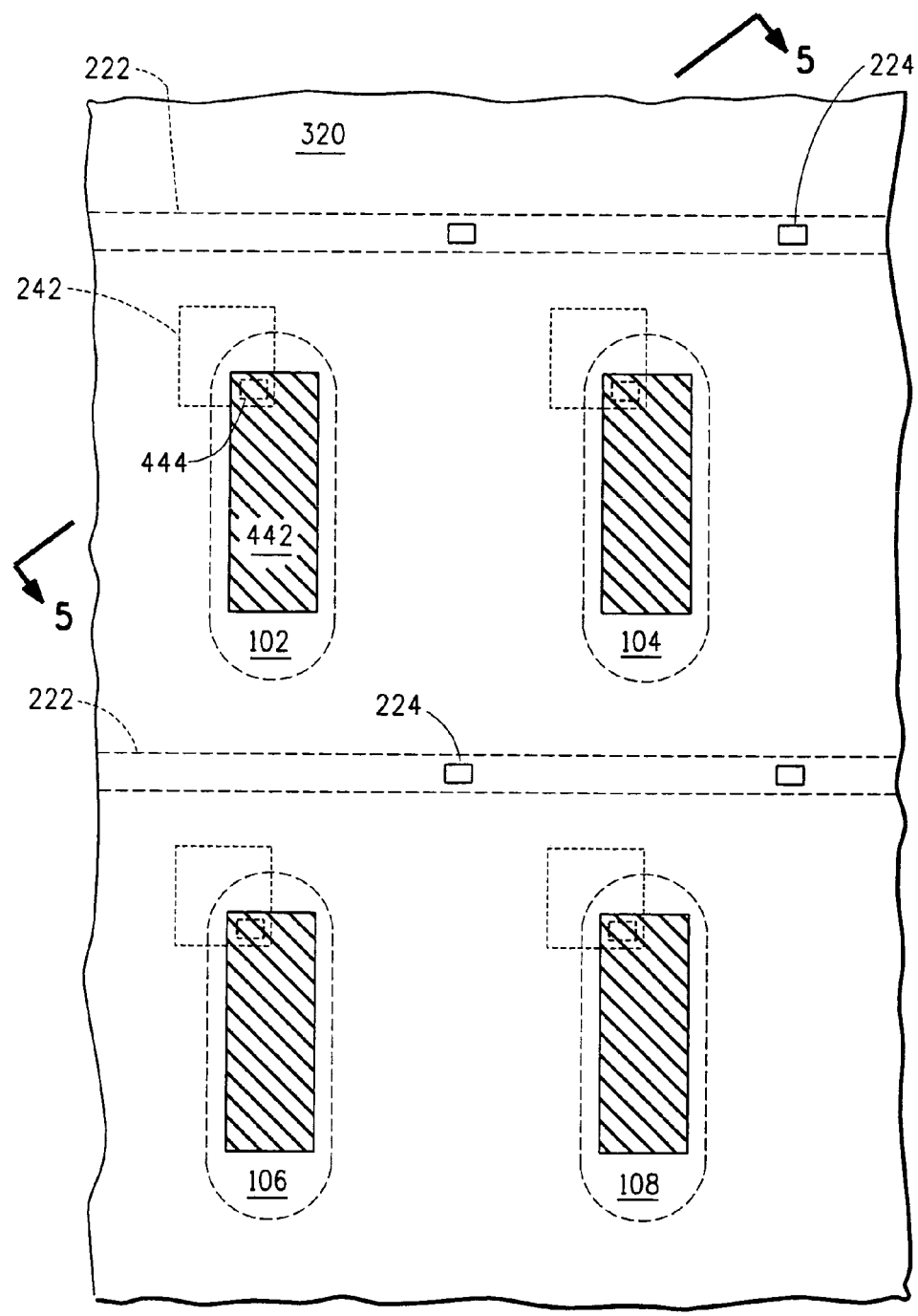

First electrodes 442 are formed over portions of the insulating layer 320 and pixel driving circuits 242 as illustrated in FIGS. 4 and 5. In one embodiment, the first electrodes 442 are anodes for the electronic components 128. Portions of the first electrodes 442 form contacts 444 to the first conductive members within the pixel driving circuits 242. In one embodiment, the first electrodes 442 are highly reflective to radiation to be emitted or received by electronic components 128. In a specific embodiment, the first electrodes 442 can include Cu, Al, Ag, Au and combinations thereof, or other metallic materials typically used for anodes in top-emission display devices. In one embodiment, the first electrodes 442 are transparent to radiation to be emitted or received by the electronic components 128. In a specific embodiment, the first electrodes 442 include indium tin oxide ("ITO"), indium zinc oxide ("IZO"), aluminum tin oxide ("ATO"), or other metallic materials typically used for anodes in bottom-emission display devices. In this embodiment, the first electrodes 442 transmit at least 70% of the radiation to be emitted from or responded to by subsequently-formed organic active layer(s). Such radiation is emitted from or received at the user side 302 of the substrate 300. In one embodiment, the thickness of the first electrodes 442 is in a range of approximately 100-200 nm. If radiation does not need to be transmitted through the first electrodes 442, the thickness may be greater, such as up to 1000 nm or even thicker.

In one embodiment, the first electrodes 442 are formed by placing a stencil mask over the substrate 300 and using a conventional physical vapor deposition technique to deposit the first electrodes 442 as illustrated in FIGS. 4 and 5. In another embodiment, the first electrodes 442 are formed by blanket depositing one or more of the layers for the first electrodes 442. A masking layer (not illustrated) is then formed over portions of the layer(s) that are to remain to form first electrodes 442. A conventional etching technique is used to remove exposed portions of the layer(s) and leave the first electrodes 442. During the etching, the layer(s) overlying and within the openings 224 (to the second conductive member 222) are removed. In this embodiment, the layer(s) of the first electrodes 442 and the second conductive member 222 include different materials. The use of different materials allows the layer(s) for the first electrodes 442 to be removed selectively to the second conductive member 222. In another embodiment (not illustrated), the pattern of the masking layer can be changed so that portions of the layer(s) (for the first electrodes 442) may remain within the openings 224. However, such portions remaining within the openings 224 would be spaced apart from the first electrodes 442 so that a connection is not made between the first electrodes 442 and the second conductive member 222. After the etching, the masking layer is removed using a conventional technique.

In one embodiment, an electronic device includes an array of organic electronic components and a structure having pixel openings, vias, and channels connecting the pixel openings and vias. Each of the pixel openings corresponds to a perimeter of each of the organic electronic components when viewed from a plan view. The structure has a negative slope at the pixel openings when viewed from a cross-sectional view. Each organic electronic component may include first and second electrodes (e.g. an anode and a cathode) separated by one or more layers including an organic active layer. When viewed from a cross-sectional view, the structure may have a negative slope, a positive slope, or a vertical slope at the vias. In one embodiment, the exemplary electronic device may also include a second structure that has a positive slope, such as a channel structure located at least partially within the channels.

In one exemplary embodiment, the array of organic electronic components may be part of a top-emission display (emission through the encapsulating layer, lid, or both). In another exemplary embodiment, the array of organic electronic components may be part of a bottom-emission display (emission through the substrate). As such, exemplary embodiments of the electronic device may include top-emission and bottom-emission displays.

Generally, each organic electronic component includes two electrodes separated by one or more organic active layers. In addition, one or more other layers, such as buffer, charge-blocking, charge-injecting, and charge-transport layers, may be included between the two electrodes. Structures having pixel openings that correspond to the perimeter of each of the organic electronic components define wells, within which portions of the organic electronic components are formed. As such, these structures may periodically be described as well structures herein.

The cross section of the well structures may influence organic layer formation. At the pixel opening, the structure may have a negatively sloped wall or perimeter and form an acute angle with an underlying structure. A portion of a perimeter of an exemplary structure forms an acute angle between the surface of an underlying structure and the structure wall. In one exemplary embodiment, the angle is between 0° and 90°, such as between 0° and 60° or between 10° and 45°. In an alternative embodiment, the angle may be about equal to or greater than the capillary angle.

Figure 6:
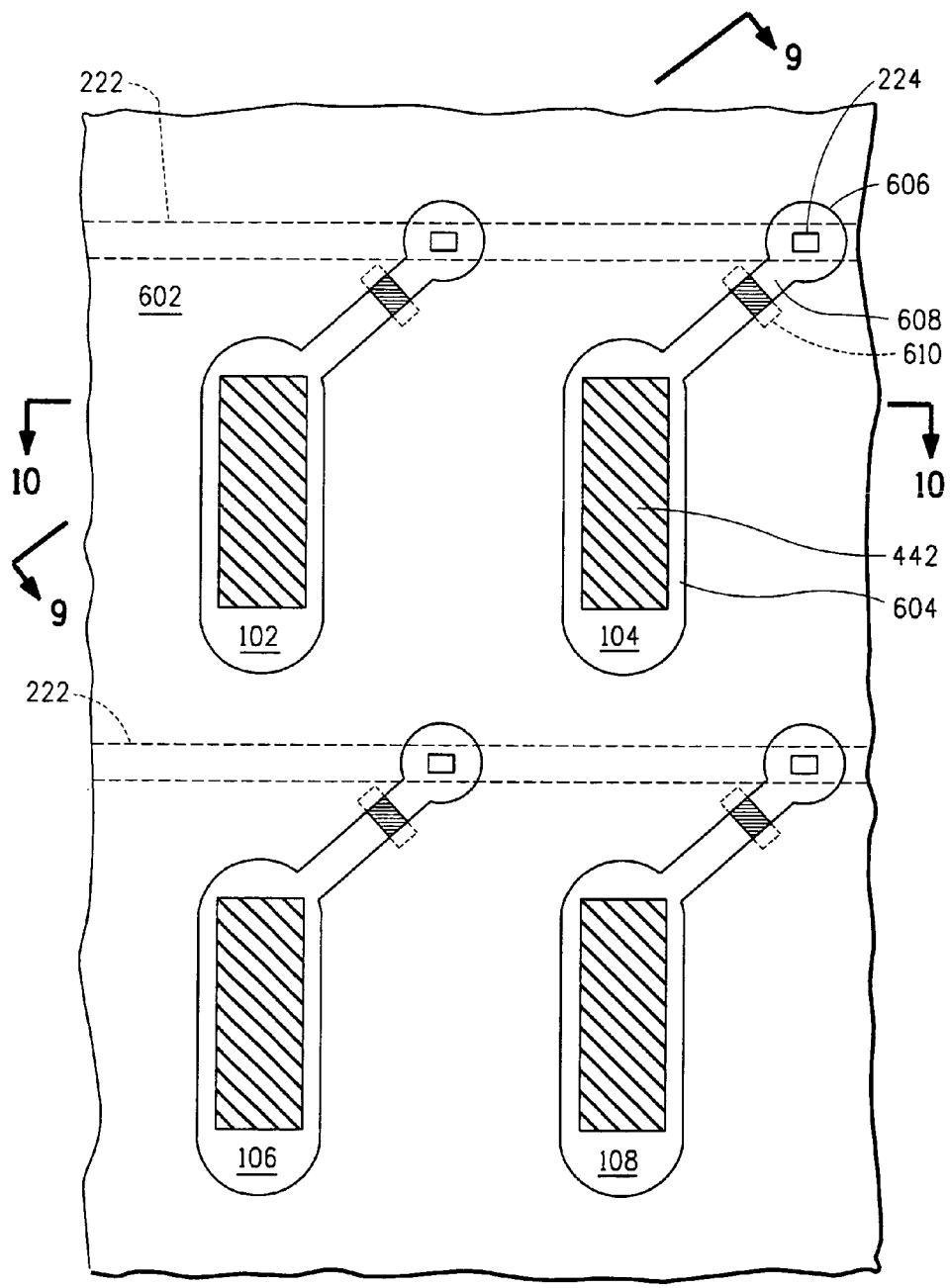
FIG. 6 includes an illustration of a plan view of an exemplary well structure.

FIG. 6 includes a plan view illustration of a point in a sequence for forming exemplary structures. A well structure 602 overlies a substrate and has pixel openings 604, vias 606, and channels 608 between the pixel openings 604 and vias 606. From a cross-sectional view, the well structure 602 has a negative slope at the pixel openings 604. The pixel openings 604 and vias 606 are connected by the channels 608. Optionally, a channel structure 610 lies within the channel 608.

First electrodes 442 are exposed by the pixel openings 604. The pixel openings 604 correspond to electronic components. The electronic components may include the underlying first electrodes 442, an organic layer lying at least partially within the pixel openings 604 (not illustrated), and an overlying electrode (not illustrated). The second conductive member 222 underlying the well structure 602 is at least partially exposed by the vias 606 at openings 224.

In one example, the well structure 602 may have a thickness between approximately 2 and 10 micrometers. The channel structure 610 may have a thickness not greater than 10 micrometers. For example, the channel structure 610 may have a thickness of less than 3 micrometers, such as between approximately 1 and 3 micrometers or less than 1 micrometer such as approximately 0.4 micrometers. The well structure 602 may, for example, have a thickness at least 1.5 times greater than that of the channel structure 610. Alternatively, the thickness of the channel structure 610 is equal to or greater than the thickness of the well structure 602.

In another embodiment, the channel 608 or channel structure 610 have surfaces that exhibit poor wetting, such as substantially hydrophobic surfaces. The surfaces exhibit wetting angles with liquid compositions greater than 45°, such as 90° or higher. In contrast, underlying structures, such as first electrodes 442, may have substantially hydrophilic surfaces, exhibiting wetting angles of liquid compositions less than 90°, such as less than 60° or between approximately 0° and about 45°. In one exemplary embodiment, both the channel 608 and the channel structure 610 have surfaces that exhibit poor wetting, such as substantially hydrophobic surfaces.

Figure 7:
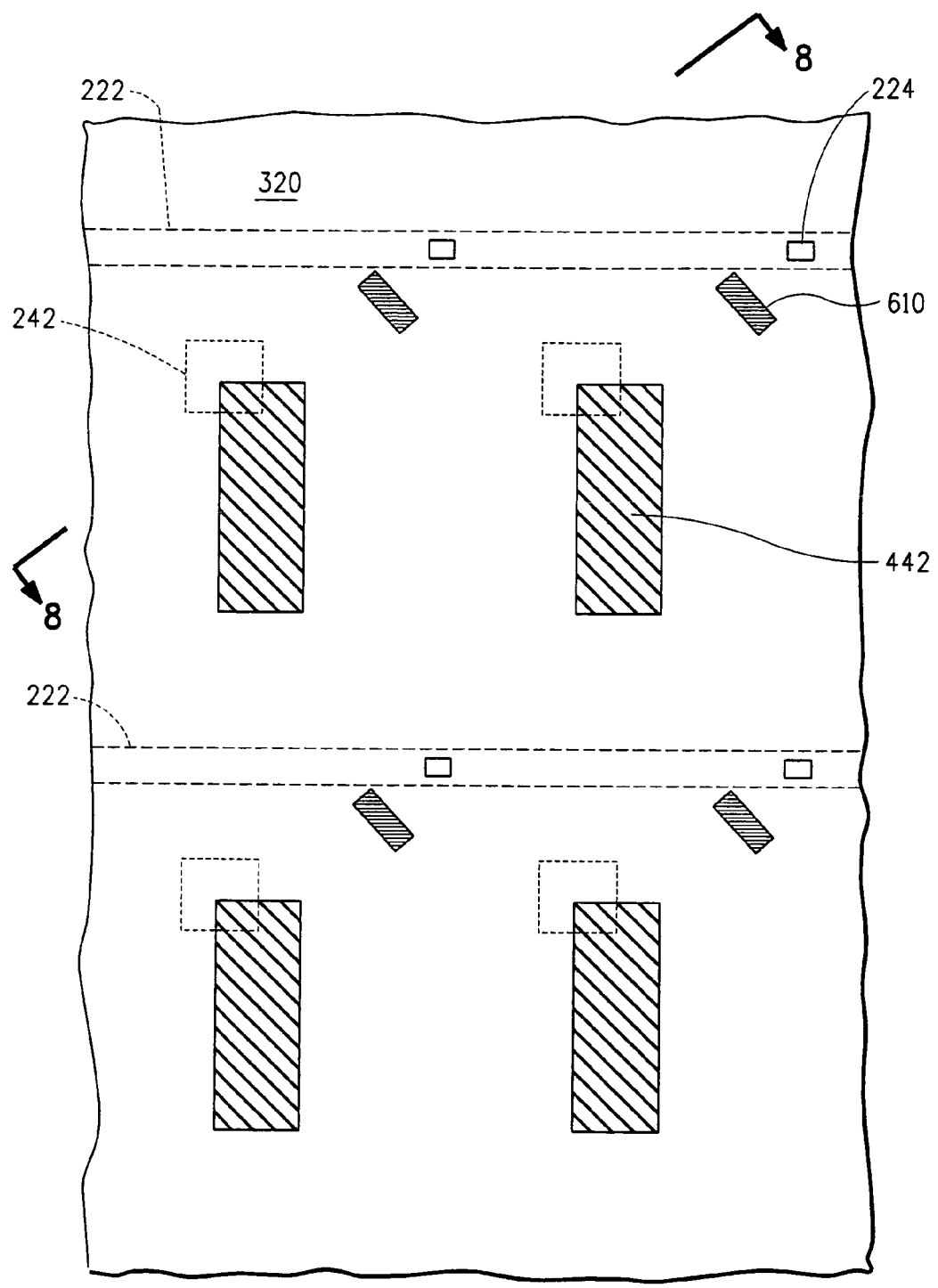
FIGS. 7 and 8 include illustrations of a plan view and a cross-sectional view, respectively, of the portion of the substrate of FIGS. 4 and 5 after forming a channel structure over the substrate.
Figure 8:
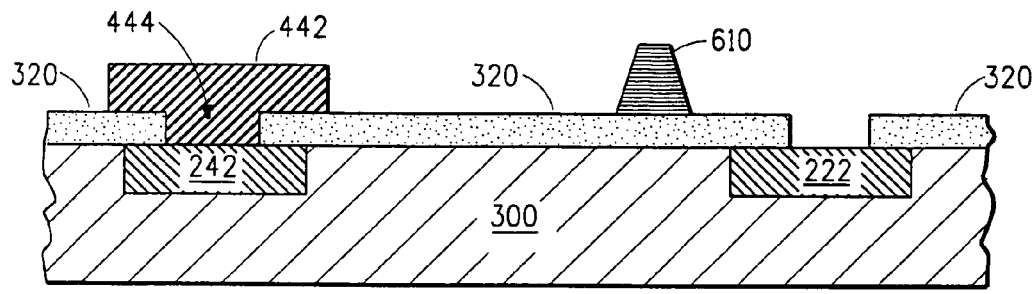

In one embodiment, after formation of first electrodes 442, a subsequent layer may be deposited and patterned to form channel structures 610 as illustrated in FIG. 7. FIG. 8 illustrates a cross-sectional view as viewed from sectioning line 8-8 in FIG. 7. Channel structures 610 are located between the first electrodes 442 and the openings 224 (to the second conductive members 222). In one embodiment, the channel structures 610 do not contact the first electrodes 442 or the second conductive members 222 and are spaced from the first electrodes 442 to prevent thinning of the thickness of a subsequently formed organic active layer in proximity to the first electrodes 442. The channel structures 610 may, for example, be spaced from the first electrodes by at least approximately 1 micron, such as at least approximately 5 microns. In particular embodiments, thinning of the thickness of the organic active layer is undesirable and may result in electrical shorts and current leakage. In one exemplary embodiment, the channel structures 610 have a positive slope. Alternatively, the channel structures 610 have a vertical or negative slope.

In one exemplary embodiment, the channel structures 610 may be formed from one or more resist or polymeric layers. The resist layer can, for example, be a negative resist material or positive resist material. The resist layer can be deposited on the insulating layer 320 and over the first electrodes 442 and the openings 224. Liquid deposition techniques include spin coating, gravure coating, curtain coating, dip coating, slot-die coating, spray coating, continuous nozzle coating, continuous dispense techniques, ink jet printing, gravure printing, screen printing or any combination thereof. The resist may be patterned through selective exposure to radiation, such as ultraviolet (UV) radiation. In one embodiment, the resist layer is spin deposited and baked (not illustrated). The resist layer is exposed to UV radiation through a mask (not illustrated), developed, and baked, leaving channel structures 610 having a positive slope. The channel structures 610 may further be hard baked, further UV cured, or both. In other embodiments, other methods (e.g., screen printing, gravure printing, etc.) may be used to form the channel structures 610.

Alternatively, channel structures 610 may be formed of inorganic materials, such as metals, oxides, and nitrides. Such inorganic materials may be deposited and patterned using conventional techniques.

Figure 9:
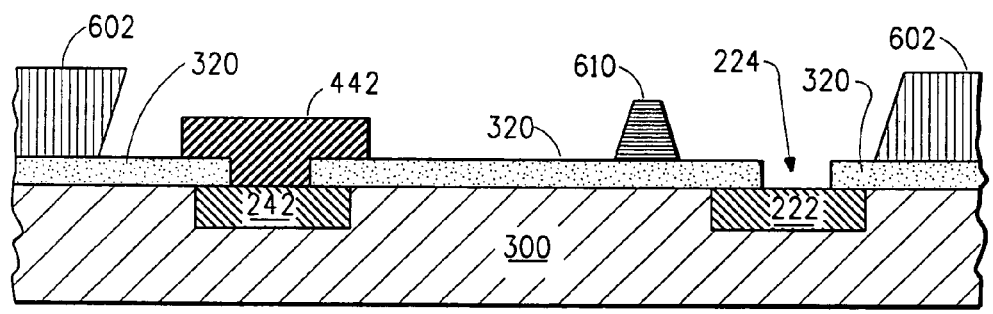
FIGS. 9 and 10 include cross-sectional view illustrations of the portion of the substrate of FIGS. 7 and 8 after formation of a well structure over the substrate.
Figure 10:
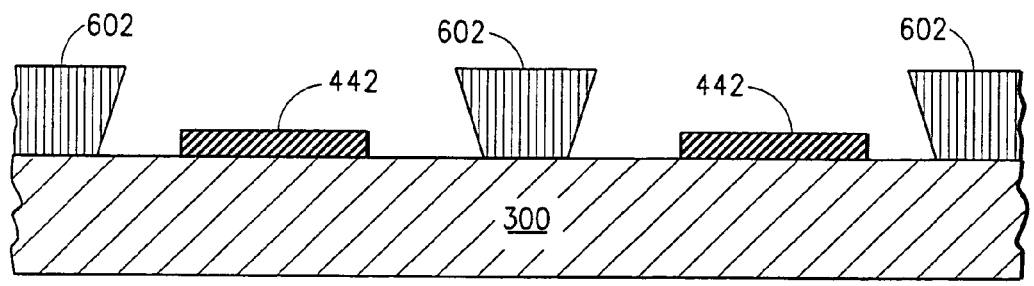

Another layer may be deposited and patterned into well structures, as illustrated in FIG. 6. FIGS. 9 and 10 illustrate cross-sectional views as viewed from sectioning lines 9-9 and 10-10, respectively, in FIG. 6. A well structure 602 includes pixel openings 604, vias 606 and channels 608. The pixel openings 604, vias 606, and channels 608 may expose portions of the first electrodes 442, portions of the second conductive members 222, and portions of the channel structures 610. As seen from the plan view, the bottom of the pixel openings 604 may include portions of the first electrodes 442 or may also encompass a portion of the insulating layer 320, and the bottom of the vias 606 may include portions of the second conductive members 222 or may also encompass a portion of the the insulating layer 320. At the pixel openings 604, the well structure 602 has a negative slope, as illustrated in FIG. 10.

The well structure 602 may have a pattern. The pattern may, for example, be the pattern illustrated in FIG. 6. Alternative patterns can include a virtually limitless number of possibilities and can be derived by skilled artisans to suit their needs for fabrication processing and device performance. As illustrated in FIG. 6, the pattern defines the pixel openings 604, the vias 606, and the channels 608. The pixel openings 604 are generally arranged in an array, such as in columns and rows. The channels 608 may connect a single pixel opening 604 with a single via 606. Alternatively, two or more channels 608 may connect adjacent pixel openings 604 with a single via 606. Conversely, two or more channels 608 may connect a single pixel opening 604 with two or more vias 606. Finally, multiple channels 608 may be used to connect multiple pixel openings 604 with a single via 606 and multiple vias 606 with a single pixel opening 604. Skilled artisans will be able to design an appropriate arrangement of channels 608 to meet their fabrication processing and device performance needs.

The well structure 602 is formed such that the channel structures 610 are located between pixel openings 604 and vias 606 and are at least partially located within the channels 608. The first electrodes 442 may be exposed along the bottoms of the pixel openings 604, and the second conductive member 222 may be exposed along the bottoms of the vias 606. In one embodiment, the first electrodes 442 underlie both the pixel openings 604 and portions of the channels 608. In another embodiment, the first electrodes 442 extend to and stop at the channels 608. In a further embodiment, the first electrodes 442 underlie a portion of the pixel openings 604 and the pixel openings 604 expose a portion of the insulating layer 320.

In one exemplary embodiment, the height of the channel structures 610 is less than the height of the well structure 602. When the height of the channel structures 610 is less than the height of the well structure 602, the channel structures 610 may be sloped positively, negatively, or vertical. Alternatively, the height of the channel structures 610 is equal to or greater than the height of the well structure 602. In particular embodiments, the height of the well structures, the height of the channel structures, or any combination thereof are approximately 2 to 10 micrometers.

In one exemplary embodiment, the well structure 602 may be formed from resist or polymeric layers. The resist layer may, for example, be a negative resist material or positive resist material. The resist layer may be deposited on the insulating layer 320 and over the first electrodes 442. Liquid deposition techniques include spin coating, gravure coating, curtain coating, dip coating, slot-die coating, spray coating, continuous nozzle coating, continuous deposition coating, ink jet printing, gravure printing, screen printing, or any combination thereof. The resist layer may be patterned through selective exposure to radiation, such as ultraviolet (UV) radiation. In one embodiment, the resist layer is spin deposited and baked (not illustrated). The resist layer is exposed to UV radiation through a mask (not illustrated), developed, and baked, leaving a structure having a negative slope at the openings. The negative slope can be achieved by (1) using a UV flood exposure (not collimated) when using the masks or (2) overexposing the resist layer while the mask lies between the resist layer and a radiation source (not illustrated). Once formed, the well structure 602 may be hard baked, further UV cured, or both.

In another exemplary embodiment (not illustrated), a sacrificial structure may be used. In one embodiment, a sacrificial layer is deposited and patterned to form a sacrificial structure having a positive slope. In a more specific embodiment, from a cross-sectional view, the sacrificial structure has a complementary profile as compared to the well structure 602 that is subsequently formed. The thickness of the sacrificial layer is substantially the same as the subsequently formed well structure. In one embodiment, a sacrificial layer is deposited over the first electrodes 442 and the insulating layer 320. A patterned resist layer is formed over the sacrificial layer using a conventional technique. In one specific embodiment, a conventional resist-erosion etching technique is used to form sloped sidewalls. In another specific embodiment, a conventional isotropic etch is used. The patterned resist layer is then removed using a conventional resist removal process.

Another layer that will be used for the well structure 602 is deposited over the sacrificial structure and within openings in the sacrificial structure. In one embodiment, that other layer has a thickness at least as thick as the thickness of the sacrificial structures. In other embodiment, that other layer is substantially thicker than the sacrificial layer. Portions of the other layer lying outside the sacrificial structure are removed using an etching or a polishing technique that is conventional within the inorganic semiconductor arts. After the portions have been removed, the well structure 602 is formed. The sacrificial structure is then removed to form the pixel openings 604, vias 606, and channels 608 within the well structure 602.

In one embodiment, the materials for the well and sacrificial structures are different to allow the material of one of the well and sacrificial structures to be removed selectively compared to the other structure. An exemplary material includes a metal, an oxide, a nitride, a resist material, or any combination thereof. The material for the sacrificial layer may be selected so that it can be selectively removed from the insulating layer 320 without causing significant damage to the first electrodes 442. After reading this specification, skilled artisans will be able to choose materials that meet their needs or desires.

In one embodiment, a combination of techniques described above for forming the well structure 602 may be used to produce pixel openings 604 and channels 608 with a negative slope and vias 606 with a positive slope. In one exemplary embodiment (not illustrated), a sacrificial layer may be deposited and patterned to form a sacrificial structure with a negative slope over openings 224. A patterned resist layer is formed over the sacrificial structure and patterned and exposed using conventional techniques to form the well structure 602 with a negative slope at the pixel openings 604 and channels 608. The sacrificial structure can then be removed to form the vias 606 with a positive slope. After reading this specification, skilled artisans will be able to choose a combination of techniques to form any number of combinations of positive, negative, and vertical slopes in a well structure with any number of different types of openings, channels or other features.

Once the well structure 602 and the channel structure 610 are formed, the first electrodes 442 exposed along the bottoms of the pixel openings 604 and the second conductive member 222 exposed along the bottom of the vias 606 may be cleaned, such as through UV/ozone cleaning. The well structures 602 and channel structures 610 may be treated to produce surfaces that wet poorly with respect to liquid compositions used in the formation of organic layers, such as hydrophobic surfaces. For example, a fluorine-containing plasma may be used to treat the surfaces of the channel structures 610 and well structures 602. The fluorine plasma may be formed using gasses such as $CF_4$, $C_2F_6$, $NF_3$, $SF_6$, or any combination thereof. The plasma process may include direct exposure plasma or use a downstream plasma. In addition, the plasma may include $O_2$. In one exemplary embodiment, a fluorine-containing plasma may include 0-20% $O_2$, such as about 8% $O_2$.

In one particular embodiment, the plasma is produced using a March PX500 model plasma generator by March Plasma Systems of Concord, Calif. The equipment is configured in flow through mode with a perforated, grounded plate and a floating substrate plate. In this embodiment, a 15 cm (6-inch) floating substrate plate is treated with a plasma formed from a $CF_4/O_2$ gas composition. The gas composition may include 80-100% $CF_4$, such as approximately 92% $CF_4$, and 0-20% $O_2$, such as approximately 8% $O_2$ by volume. The substrate may be exposed for 2-5 minutes, such as approximately 3 minutes, at a pressure of 300-600 mTorr, such as a 400 mTorr, using a 200-500 W plasma, such as a 400 W plasma.

Figure 11:
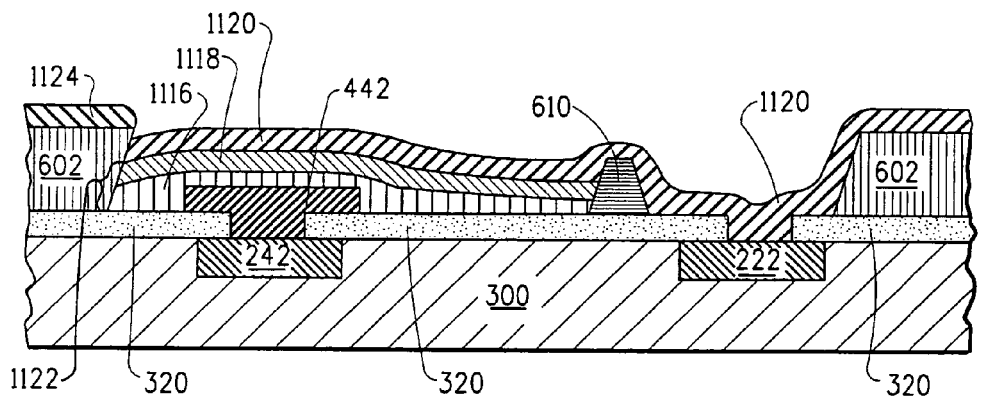
FIGS. 11 and 12 include cross-sectional view illustrations of the portion of the substrate of FIGS. 9 and 10, respectively, after forming an electrode over the well structure.
Figure 12:
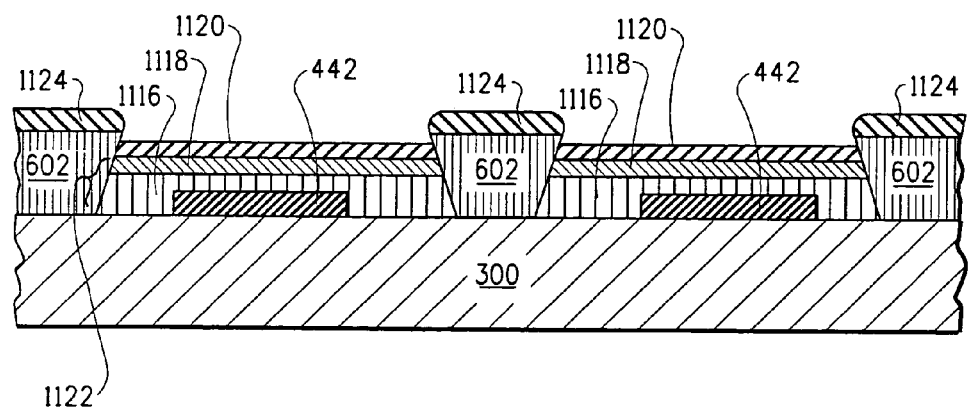

FIGS. 11 and 12 include illustrations of cross-sectional views after an organic layer 1122 and a second electrode 1120 are formed. For example, organic layer 1122 may include one or more organic layers. In one embodiment as illustrated in FIG. 11, the organic layer 1122 includes a charge transport layer 1116 and an organic active layer 1118. When present, the charge transport layer 1116 is formed over the first electrodes 442 and before the organic active layer 1118 is formed. The charge transport layer 1116 can serve multiple purposes. In one embodiment, the charge transport layer 1116 is a hole-transport layer. Although not illustrated, an additional charge transport layer may be formed over the organic active layer 1118. Therefore, the organic layer 1122 may include the organic active layer 1118 and one, both or none of the charge transport layers. Each of the charge transport layer 1116, the organic active layer 1118, and additional charge transport layer may include one or more layers. In another embodiment, a single layer having a graded or continuously changing composition may be used instead of separate charge transport and organic active layers.

Returning to FIGS. 11 and 12, the charge transport layer 1116 and the organic active layer 1118 are formed sequentially over the first electrodes 442. Each of the charge transport layer 1116 and the organic active layer 1118 can be formed by, for example continuous nozzle coating, continuous deposition coating, ink jet printing, gravure printing, screen printing, vapor depositing, or any combination thereof. Any patterned deposition technique that avoids coating the organic layer 1122 directly over the vias 606 may be used. For example, liquid compositions including the organic materials may be dispensed through one or more nozzles, such as micronozzles to form lines of deposited material over columns, or rows, of pixel openings 604, but not over columns or rows of vias 606. One or both of the charge transport layer 1116 and the organic active layer 1118 may be cured after application.

In this embodiment, the charge transport layer 1116 is a hole-transport layer. The hole-transport layer can be used to potentially increase the lifetime and improve the reliability of the device compared to a device where the first electrodes 442 would directly contact the organic active layer 1118. In one specific embodiment, the hole-transport layer can include an organic polymer, such as polyaniline ("PANI"), poly(3,4-ethylenedioxythiophene) ("PEDOT"), or an organic charge transfer compound, such as tetrathiafulvalene tetracyano-quinodimethane (TTF-TCQN). The hole-transport layer typically has a thickness in a range of approximately 100-250 nm.

The hole-transport layer typically is conductive to allow electrons to be removed from the subsequently formed organic active layer 1118 and transferred to the first electrodes 442. Although the first electrodes 442 and the optional hole-transport layer are conductive, typically the conductivity of the first electrodes 442 is significantly greater than that of the hole-transport layer.

The composition of the organic active layer 1118 typically depends upon the application of the organic electronic device. When the organic active layer 1118 is used in a radiation-emitting organic electronic device, the material(s) of the organic active layer 1118 will emit radiation when sufficient bias voltage is applied to the electrode layers. The radiation-emitting active layer may contain nearly any organic electroluminescent or other organic radiation-emitting materials. Such materials can be small molecule materials or polymeric materials. Small molecule materials may include those described in, for example, U.S. Pat. No. 4,356,429 and U.S. Pat. No. 4,539,507. Alternatively, polymeric materials may include those described in U.S. Pat. No. 5,247,190, U.S. Pat. No. 5,408,109, and U.S. Pat. No. 5,317,169. Exemplary materials are semiconducting conjugated polymers. An example of such a polymer is poly(phenylenevinylene) ("PPV"). The light-emitting materials may be dispersed in a matrix of another material, with or without additives, but typically form a layer alone. The organic active layer generally has a thickness in the range of approximately 40-100 nm.

When the organic active layer 1118 is incorporated into a radiation receiving organic electronic device, the material(s) of the organic active layer 1118 may include many conjugated polymers and electroluminescent materials. Such materials include, for example, many conjugated polymers and electro- and photo-luminescent materials. A specific example includes poly(2-methoxy, 5-(2-ethyl-hexyloxy)-1,4-phenylenevinylene) ("MEH-PPV") or MEH-PPV composite with CN-PPV. The organic active layer 1118 typically has a thickness in a range of approximately 50-500 nm.

Although not illustrated, an optional electron-transport layer may be formed over the organic active layer 1118. The electron-transport layer is another example of a charge transport layer. The electron-transport layer typically is conductive to allow electrons to be injected from a subsequently formed cathode and transferred to the organic active layer 1118. Although the subsequently formed cathode and the optional electron-transport layer are conductive, typically the conductivity of the cathode is significantly greater than that of the electron-transport layer.

In one specific embodiment, the electron-transport layer can include metal-chelated oxinoid compounds (e.g., $Alq_3$); phenanthroline-based compounds (e.g., 2,9-dimethyl-4,7-diphenyl-1,10-phenanthroline ("DDPA"), 4,7-diphenyl-1,10-phenanthroline ("DPA")); azole compounds (e.g., 2-(4-biphenyl)-5-(4-t-butylphenyl)-1,3,4-oxadiazole ("PBD"), 3-(4-biphenyl)-4-phenyl-5-(4-t-butylphenyl)-1,2,4-triazole ("TAZ"); or any one or more combinations thereof. Alternatively, the optional electron-transport layer may be inorganic and comprise BaO, LiF, or $Li_2O$. The electron-transport layer typically has a thickness in a range of approximately 30-500 nm.

Any one or more of the charge transport layer 1116, organic active layer 1118, and additional charge transport layer may be applied as a liquid composition that includes one or more liquid media. The hydrophobic and hydrophilic surfaces of the well structure 602 are specific with respect to the liquid media within the liquid composition. In one embodiment, the liquid composition may include a co-solvent including, for example, an alcohol, a glycol, a glycol ether, or any combination thereof. A solvent for the organic active layer liquid media may be select such that it does not dissolve the charge transport layer 1116. Alternatively, the solvent may be selected such that the charge transport layer 1116 is soluble or partially soluble in that solvent.

In a particular embodiment, the negative slope of the well structure 602 at the pixel openings 604 causes a capillary effect, drawing a liquid composition of the organic layer 1122 around the perimeter of the pixel openings 604. Once cured, the organic layer 1122 covers one or more underlying layers within the pixel openings 604, such as the first electrodes 442.

A second electrode 1120 is formed over the organic layer 1122, which in this embodiment includes the charge transport layer 1116 and the organic active layer 1118. In one embodiment, a layer is vapor deposited to form third conductive members 1124 on the well structures 602 and to form the second electrodes 1120 over the organic active layer 1118 and over portions of the channel structures 610 and the second conductive members 222. The difference in elevation between the second electrode 1120 and the third conductive members 1124 keeps them from being connected. As illustrated in FIG. 11, the second electrode 1120 overlies layers within the pixel openings 604, the vias 606, and portions of the channel structures 610. The portions of the second electrode 1120 overlying the organic layers 1122 within the pixel openings 604, the portions of the second electrode 1120 overlying the second conductive members 222 within the vias 606, and the portions of the second electrode 1120 overlying portions of the channel structure 610 are connected to each other to form an electrically continuous structure. Alternatively, a layer may be deposited using a stencil mask to form the second electrodes 1120. A conventional evaporation technique, or sputtering technique is used to form the second electrodes 1120.

In one embodiment, the second electrodes 1120 act as cathodes. A layer of the second electrodes 1120 closest to the organic layer 1122 can be selected from a Group 1 metal (e.g., Li, Cs), a Group 2 (alkaline earth) metal, a rare earth metal including any one or more of the lanthanides, the actinides, or any combination thereof. The second electrode 1120 and the conductive members 1124 have a thickness in a range of approximately 5-600 nm, depending on the desired transparency of the second electrode 1120. In one specific, non-limiting embodiment for a top-emission display, a Ba layer of less than approximately 10 nm, followed by an Ag layer of approximately 15 nm, followed by an ITO layer of approximately 100 nm may be deposited to provide a second electrode 1120 that is a transparent cathode. In another exemplary embodiment for a bottom-emission display, a Ba layer of approximately 10 nm followed by an Al layer of approximately 500 nm may be used for the second electrode 1120.

As depicted in FIGS. 11 and 12, the organic electronic components, including the first electrodes 442, the organic layers 1122, and the second electrodes 1120, are addressable via the driving circuit 242. For example, applying a potential across each of the second electrodes 1120 and one selected driving circuit 242 activates one organic electronic component.

An encapsulating layer (not illustrated), including a lid and a dessicant, can be formed over the array, and peripheral and remote circuitry may be formed using any number of the previously described or additional layers. The encapsulating layer may be attached at locations beyond the perimeter of the array such that no organic layers lie between it and the substrate. Radiation may be transmitted through the encapsulating layer. If so, the encapsulating layer should be transparent to the radiation. Although not illustrated, additional insulating layer(s) and interconnect level(s) may be formed to allow for circuitry in peripheral areas (not illustrated) that may lie outside the array. Such circuitry may include row or column decoders, strobes (e.g., row array strobe, column array strobe), or sense amplifiers.

3. OTHER EMBODIMENTS

The electronic device may alternatively be formed without the formation of channel structures. The well structure defines pixel openings, vias, and channels. The width of the channels may be adjusted to limit liquid composition wicking and to limit liquid composition flow. Generally, narrower channels are more likely to result in wicking and wider channels aid in liquid composition flow. Channels of medium width limit both liquid wicking and liquid composition flow. In further exemplary embodiments, the well structure may be formed from more than one layer or structure.

In a further embodiment, the process for forming the electronic device may be used in fabricating radiation responsive devices, such as sensor arrays, photodetectors, photoconductive cells, photoresistors, photoswitches, phototransistors, phototubes, IR detectors, biosensors, photovoltaics or solar cells. Radiation responsive devices may include a transparent substrate and transparent substrate side electrode. Alternatively, the radiation responsive device may include a transparent overlying electrode.

In still a further embodiment, the process for forming the electronic device may be used for inorganic devices. In one embodiment, a liquid composition for forming an inorganic layer may be used and allow better coverage of the liquid composition adjacent to the same or other structures having a negative slope.

In one embodiment, referring to FIG. 11, fabrication of at least some of the layers within the electronic device 100 would be reversed, although the layout would be substantially the same. For example, the first electrodes 442 would be the cathodes for the electronic components 128. The first electrodes 442 would be connected to the appropriate source/drain regions of the driving transistors 126 within the pixel driving circuits 242. The fabrication of the layer(s) within the first electrodes 442 would be the reverse of that previously described. The low work function material would be in contact with organic layer 1122. The organic active layer 1118 would be formed before the charge transport layer 1116. The second electrodes 1120 would be the anodes for the electronic components 128. The second electrodes 1120 would connect to the second conductive member 222, which in this embodiment is part of the $V_{dd}$ line 146. This embodiment may be useful in forming a top-emission display with a transparent anode, or in forming a transparent display that exhibits both top-emission and bottom-emission.

Many other embodiments are possible but are not described. For example, after reading this specification, skilled artisans will know how to combine any one or more of the features for any of the described embodiments with each other to form new embodiments.

4. ADVANTAGES

The embodiments described herein may have any one or more of the advantages as described herein. In one embodiment, the substrate 300 including pixel driving circuits 242 may be fabricated by one manufacturer, and the electronic components 128 may be fabricated by a different manufacturer. The substrate 300 manufacturer may already include terminal connections and power transmission lines for the electronic device 100. Therefore, the second conductive member 222 may already exist when the different manufacturer starts fabricating the electronic device 100.

In one particular embodiment, the patterned well structure including pixel openings, vias and channels and, optionally, the channel structures facilitate formation of electrodes that provide a conduction path between an electronic component and a power transmission line. These structures are compatible with normal incident angle deposition techniques useful in forming electrodes, such as cathodes. Typically, these deposition techniques are less expensive and, in some examples, quicker, leading to less expensive electronic devices and improved production rates.

In some embodiments, an advantage is that the layout and fabrication can be used with top-emission displays. If the second electrodes 1120 are significantly transparent to radiation (i.e., a transmission of at least 70% of the radiation to or from the organic layer 1122), the connection from the second conductive member 222 to the second electrode 1120 through the vias 606 provides sufficient current to the electronic components 128, allowing for the manufacturing of top-emission displays with a large number of pixels across a large array.

In other embodiments, using channels 608 to make multiple connections between pixel openings 604 and vias 606 can provide an advantageous level of redundancy in making a large number of electrical connections across a large array of electronic components, compensating for potential manufacturing defects.

Note that not all of the activities described above are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. An electronic device comprising:
   a substrate comprising a first pixel driving circuit, a first conductive member, and a second conductive member, wherein the first and second conductive members are spaced apart from each other, the first conductive member is connected to the first pixel driving circuit, and the second conductive member is part of a power transmission line;
   a well structure overlying the substrate and defining a pixel opening, a via, and a channel, wherein the pixel opening is connected to the via through the channel; and
   a first electronic component comprising:
      a first electrode that contacts the first conductive member in the pixel opening;
      a second electrode that contacts the second conductive member in the via; and
      an organic layer lying between the first and second electrodes.

2. The electronic device of claim 1, wherein:
   the substrate comprises:
      a plurality of pixel driving circuits including the first pixel driving circuit;
      additional first conductive members; and
      additional second conductive members, wherein each of the first conductive members is spaced apart from each of the second conductive members;
   the well structure comprises a plurality of pixel openings and a plurality of vias;
   the electronic device comprises an array of electronic components including the first electronic component, wherein each of the electronic components comprises:
      a first electrode that contacts at least one of the first conductive members in at least one of the pixel openings; and
      a second electrode that contacts at least one of the second conductive members in at least one of the vias; and
   the organic layer lies between the first and second electrodes.

3. The electronic device of claim 1, wherein the surface of the well structure in the channel is hydrophobic.

4. The electronic device of claim 1, wherein from a cross-sectional view, the well structure in the pixel opening has a negative slope.

5. The electronic device of claim 1, wherein from a cross-sectional view, the well structure in the channel has a positive slope.

6. The electronic device of claim 1, further comprising a channel structure within the channel, wherein from a cross-sectional view, the channel structure has a positive slope.

7. The electronic device of claim 6, wherein the well structure and the channel structure are a same material or a different material.

8. The electronic device of claim 6, wherein the surface of the channel structure is hydrophobic.

9. The electronic device of claim 1, wherein the organic layer comprises an organic active layer.

10. The electronic device of claim 1, wherein the first electronic component comprises a radiation-emitting electronic component or a radiation-responsive electronic component.

11. The electronic device of claim 10, wherein the first electronic component emits or responds to radiation through the first electrode, the second electrode, or both the first and the second electrodes.

12. The electronic device of claim 1, wherein the power transmission line is a $V_{dd}$ line or a $V_{ss}$ line.

13. The electronic device of claim 1, wherein the well structure defining the pixel opening comprises a first material and the well structure defining the via comprises a second material different from the first material.

14. A process for forming an electronic device comprising:
   forming a well structure and a first electrode over a substrate, wherein:
      the substrate comprises a first pixel driving circuit, a first conductive member, and a second conductive member;
      the first and second conductive members are spaced apart from each other;
      the well structure defines a pixel opening and a via;
      the first conductive member is connected to the first pixel driving circuit in the pixel opening; and
      the second conductive member is part of a power transmission line;
   forming a first organic layer over the first electrode; and
   forming a second electrode over the first organic layer, wherein the second electrode contacts the second conductive member in the via.

15. The process of claim 14, wherein the well structure further defines a channel, wherein the pixel opening is connected to the via through the channel.

16. The process of claim 15, further comprising treating the surface of the well structure in the channel to make the surface hydrophobic.

17. The process of claim 16, further comprising forming a channel structure within the channel, wherein from a cross-sectional view, the channel structure has a positive slope.

18. The process of claim 14, wherein the organic layer is deposited using a liquid deposition technique.

19. The process of claim 18, wherein the liquid deposition technique comprises continuous nozzle printing or ink jet printing.

20. The process of claim 14, wherein:
   the substrate comprises:
      a plurality of pixel driving circuits including the first pixel driving circuit;
      additional first conductive members; and
      additional second conductive members, wherein each of the first conductive members is spaced apart from the second conductive members;

the electronic device comprises an array of electronic components and the pixel driving circuits lie within the array;

forming the first electrode comprises forming the first electrodes over the first conductive members; and forming the second electrode comprises forming the second electrodes over the first organic layer.

* * * * *